United States Patent [19]

Chao et al.

[11] 4,448,028
[45] May 15, 1984

[54] THERMOELECTRIC SYSTEMS INCORPORATING RECTANGULAR HEAT PIPES

[75] Inventors: Shun-lung Chao, Troy; Richard A. Vining, Bloomfield Hills, both of Mich.

[73] Assignee: ECD-ANR Energy Conversion Company, Troy, Mich.

[21] Appl. No.: 373,179

[22] Filed: Apr. 29, 1982

[51] Int. Cl.³ .................. F25B 21/02; H01L 35/30
[52] U.S. Cl. ............................... 62/3; 136/205; 136/210
[58] Field of Search ............... 62/3; 136/205, 210, 136/203, 204

[56] References Cited

U.S. PATENT DOCUMENTS

| 3,324,667 | 6/1967 | Muller | 62/3 |
| 3,500,650 | 3/1970 | Mole | 62/3 |
| 3,552,133 | 1/1971 | Lukomsky | 62/3 |
| 3,794,527 | 2/1974 | Kim et al. | 136/208 |
| 3,834,171 | 10/1974 | Johansson | 62/3 |
| 4,011,104 | 3/1977 | Basiulis | 62/3 X |
| 4,065,936 | 1/1978 | Fenton et al. | 62/3 |
| 4,125,122 | 11/1978 | Stachurski | 136/205 |

Primary Examiner—Lloyd L. King
Attorney, Agent, or Firm—Lawrence G. Norris

[57] ABSTRACT

The present invention provides a low cost, compact, efficient thermoelectric system which has no moving parts for converting waste heat into electrical energy. The system includes a plurality of heat pipes having at least one substantially planar sidewall and integral heat collecting fins. The planar sidewalls on the heat pipes enable broad surface thermal contact with thermoelectric devices. The heat pipes and integral heat collecting fins provide for the efficient collection and transmission of waste heat to the side of the thermoelectric devices contacting the heat pipes at a location outside of the flow of waste heat. The other side of each thermoelectric device is either water or air cooled to establish a temperature differential thereacross for the generation of electrical energy. The heat pipes are preferably generally rectangular in cross section to provide opposed substantially planar surfaces for making efficient, low heat loss, broad surface thermal contact with the thermoelectric devices.

25 Claims, 6 Drawing Figures

THERMOELECTRIC SYSTEMS INCORPORATING RECTANGULAR HEAT PIPES

BACKGROUND

The present invention relates to new and improved thermoelectric systems including heat pipes having at least one substantially planar sidewall for efficiently transferring heat to the thermoelectric devices of the system.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new thermoelectric systems which provide more electricity.

An important part of the solution with respect to the development of permanent, economical energy conversion lies in the field of thermoelectrics wherein electrical power is generated by heat. It has been estimated that more than two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level.

Similarly the present invention provides a low cost, efficient and economical thermoelectric system to generate electrical energy from the waste heat generated by power plants, geothermal sites, automobiles, trucks and buses. Therefore by the employment of waste heat from these and other sources, regeneration of electricity can provide a direct reduction in thermal pollution, while helping to conserve valuable finite energy sources.

The efficiency of a thermoelectric system is in part dependent upon the performance characteristics of the thermoelectric devices or devices incorporated therein. The performance of a thermoelectric device can in turn be expressed in terms of a figure of merit (Z) for the material forming the devices, wherein Z is defined as:

$$Z = S^2 \sigma / K$$

Where:
Z is expressed in units $\times 10^3$
S is the Seebeck coefficient in V/°C.
K is the thermal conductivity in mW/cm−°C.
$\sigma$ is the electrical conductivity in $(\Omega-\text{cm})^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K):$K_l$, the lattice components; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems is especially difficult.

Among the best known currently existing polycrystalline thermoelectric materials are $(Bi,Sb)_2Te_3$, PbTe, and Si-Ge. The $(Bi,Sb)_2Te_3$ materials are best suited for applications in the $-10°$ C. to $+150°$ C. range with their best Z appearing at around 30° C. $(Bi,Sb)_2Te_3$ represents a continuous solid solution system in which the relative amounts of Bi and Sb are from 0 to 100%. The Si-Ge material is best suited for high temperature applications in the 600° C. to 1000° range with a satisfactory Z appearing at above 700° C. The PbTe polycrystalline material exhibits its best figure of merit in the 300° C. to 500° range. None of these materials is well suited for applications in the 100° C. to 300° C. range. This is indeed unfortunate, because it is in this temperature range where a wide variety of waste heat applications are found. Among such applications are geothermal waste heat and waste heat from internal combustion engines, in for example, trucks, buses, and automobiles. Applications of this kind are important because the heat is truly waste heat. Heat in the higher temperature ranges must be intentionally generated with other fuels and therefore is not truly waste heat.

New and improved thermoelectric alloy materials have been discovered for use in the aforesaid temperature ranges. These materials are disclosed and claimed in U.S. application Ser. No. 341,864, filed Jan. 22, 1982, now abandoned, in the names of Tumkur S. Jayadev and On Van Nguyen for NEW MULTIPHASE THERMOELECTRIC ALLOYS AND METHOD OF MAKING SAME.

The thermoelectric materials there disclosed can be utilized in the systems herein. These materials are not single phase crystalline materials, but instead, are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials, the material is designed such that the grain boundaries define regions including conductive phases therein providing numerous electrical conduction paths through the bulk material for increasing electrical conductivity without substantially affecting the thermal conductivity. In essence, these materials have all of the advantages of polycrystalline materials in desirably low thermal conductivity and crystalline bulk Seebeck properties. However, unlike the conventional polycrystalline materials, these disordered multiphase materials also have desirably high electrical conductivities. Hence, as disclosed in the aforesaid referenced application, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474 and 4,178,415 which issued in the name of Stanford R. Ovshinsky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the above-mentioned independently increased electrical conductivities. In contrast, the materials disclosed in the aforesaid referenced application are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

A thermoelectric device generates electricity by the establishment of a temperature differential across the materials contained therein. The thermoelectric devices generally include elements of both p-type and n-type material. In the p-type material the temperature differential drives positively charged carriers from the hot side to the cold side of the elements, while in the n-type material the temperature differential drives negatively charged carriers from the hot side to the cold side of the elements.

The conventional heat exchangers utilized to transfer heat to the thermoelectric device have been large, heavy and inefficient. They include many, closely spaced heat collecting surfaces which define passages that become readily clogged by the flow of a heated fluid therein. Also, conventional heat exchangers are designed such that the thermoelectric devices are an integral and inseparable part thereof. Due to this inseparability from the thermoelectric devices, it is difficult, if not impossible to clean and maintain them.

Conventional heat exchangers are also generally constructed from large amounts of copper, aluminum, or stainless steel for example. Hence, they can only be manufactured at high cost. They also exert a high back pressure in the exhaust lines of the internal combustion engines in which they are used. This makes it difficult to establish and maintain proper operation of the engines. Lastly, because the thermoelectric devices are an integral part of the heat exchangers, the thermoelectric devices are exposed to potential contamination from the exhaust gases in the exhaust lines.

SUMMARY OF THE INVENTION

The present invention provides new and improved thermoelectric systems to generate electrical energy from waste heat. The systems are compact in size and have no moving parts. Further the systems may be adapted to utilize waste heat from many different sources of waste heat, including the waste heat from internal combustion engines.

The thermoelectric systems of the present invention incorporate a plurality of heat pipes having at least one planar surface and integral heat collecting means in the form of heat collecting fins arranged within the flow of a fluid providing waste heat. The heat pipes extend externally from the flow of the heated fluid to a plurality of thermoelectric devices which are entirely separated from the flow of heated fluid. The at least one planar surface of the heat pipes makes broad surface thermal contact with one side of at least one thermoelectric device to thereby efficiently transfer the collected heat to the device. The other side of the thermoelectric device is exposed to a cooling medium to establish a temperature differential across the thermoelectric device to thereby enable the generation of electrical energy.

The heat pipes are preferably rectangular in cross section providing a pair of opposed substantially planar sidewalls for making broad surface thermal contact with the thermoelectric devices. The heat pipes are hollow and sealed and contain a working fluid therein. The working fluid acts to efficiently convey the heat collected from the heated fluid to the hot side of the thermoelectric devices. This is accomplished by taking advantage of the thermodynamics of vaporization and condensation of the working fluid. Further, since the heat pipes are sealed, they provide a continuously cycling contaminant free system.

The utilization of the rectangular heat pipes coupled with the integral heat collecting fins provide a low cost, compact, efficient heat transfer system which exhibits a low back pressure to the heated fluid flow. The system also has a longer life and is easier to clean and maintain than conventional systems.

The systems of the present invention cool the cold side of the thermoelectric devices by maintaining a flow of water or other fluids thereabout. Alternatively, the cold side of the thermoelectric devices can be cooled by exposing the same to ambient air.

DETAILED DESCRIPTION

Figure 1:
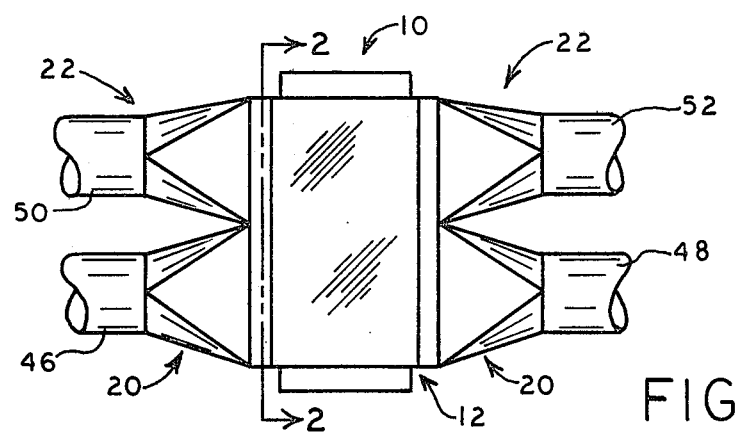
FIG. 1 is a side plan view of a thermoelectric system configured in accordance with a first embodiment of the present invention.
Figure 2:
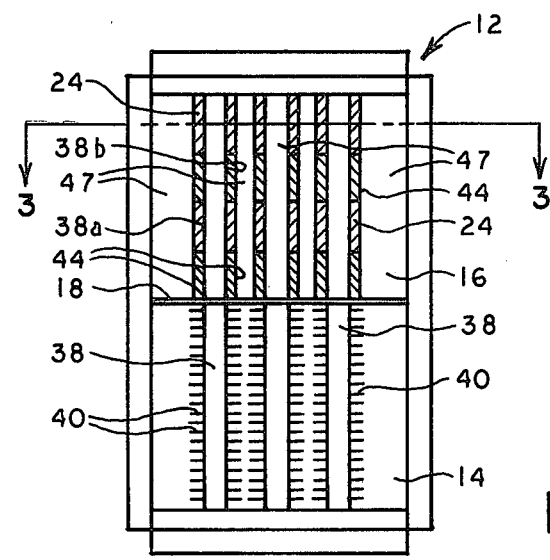
FIG. 2 is a cross-sectional view taken along line 2—2 of FIG. 1.

Referring now to FIGS. 1 and 2, there is shown a thermoelectric system 10 structured in accordance with a first embodiment of the present invention. The thermoelectric system 10 includes a heat recovery unit 12 divided into a heat recovery chamber 14 and cooling chamber 16 by partition wall 18. Fastened to the recovery unit 12 are a pair of duct means 20 and 22. Duct means 20 comprise ducts 46 and 48 for directing the flow of a fluid, heated by waste heat, through the heat recovery chamber 14. Duct means 22 comprise ducts 50 and 52 for directing the flow of a cooling fluid through the cooling chamber 16.

The heat recovered from the fluid in the heat recovery chamber 14 is transferred from the heat recovery chamber 14 to one side of a number of thermoelectric devices 24 disposed in the cooling chamber 16. The heat thus transferred maintains the one side of the thermoelectric devices at an elevated temperature. The flow of cooling fluid through the cooling chamber 16 maintains the other side of the thermoelectric devices 24 at a somewhat lower temperature. This establishes a temperature differential across the devices and thereby enables the generation of electricity.

In practicing the present invention, the thermoelectric devices 24 can take the form of the devices disclosed, for example, in U.S. application Ser. No. 372,689, filed on Apr. 29, 1982, in the names of Tumkur S. Jayadev and Shun-lung Chao for New Thermoelectric Systems and Devices, and U.S. application Ser. No. 372,688, filed on Apr. 28, 1982, in the name of Der-Jeou Chou, for Improved Thermoelectric Devices and Method of Making Same. The device of this type includes n-type and p-type thermoelectric elements.

The n-type and p-type elements are soldered to a copper lead matrix or pattern. The copper lead pattern is arranged to connect the n-type and p-type elements in electrical series in alternating relation and in thermally parallel relation.

Waste heat in the form of exhaust gases from the operation of internal combustion engines can establish a 200° C. temperature differential across the thermoelectric devices 24. If the elements of the device 24 have a Seebeck coefficient (S) of 0.15 mV/°C. then the voltage which can be produced from each element can be determined from the expression $V_{te}$ is 0.15 mV/°C. $\times$ 200° C. or 30 mV. The number of elements needed to produce 14 V, the voltage utilized in automobiles and trucks can be determined as follows:

$n = 14\ V/30\ mV = 467$

Thereafter, any number of elements in series groups of 467 elements can be connected in parallel to obtain the required current for the system at 14 V. Of course, each thermoelectric device 24 will include less than the required 467 elements. The number of devices to be connected in series relation to provide the 14 V is equal to the total number of required elements divided by the number of elements in each device. For example if each device includes 32 elements, then 467 divided by 32 devices will be required. In this example, 467 divided by 32 equals 14.6. Hence 15 devices must be connected in series to assure an output voltage of at least 14 V.

Figure 3:
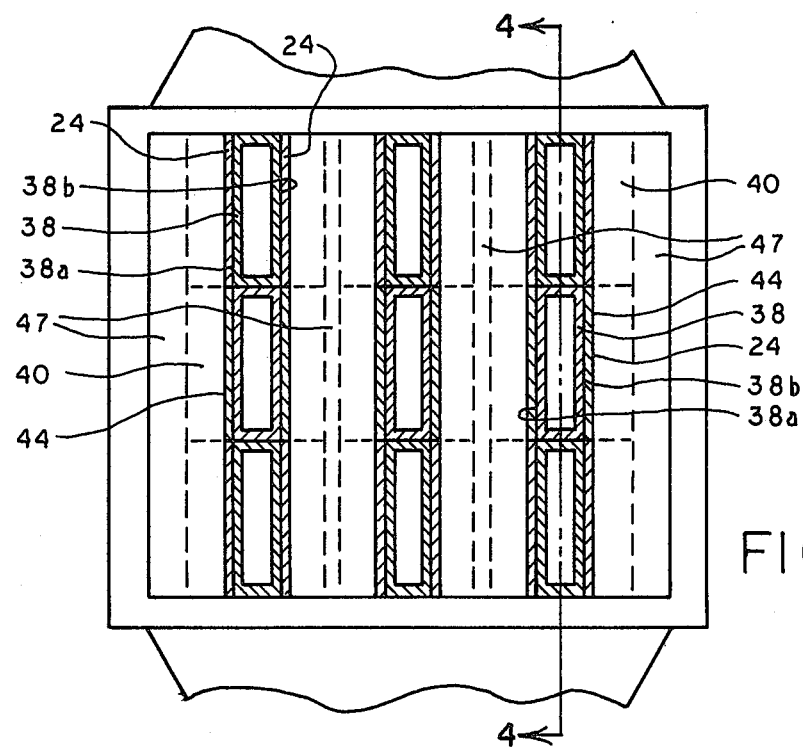
FIG. 3 is a cross-sectional view taken along line 3—3 of FIG. 2.
Figure 4:
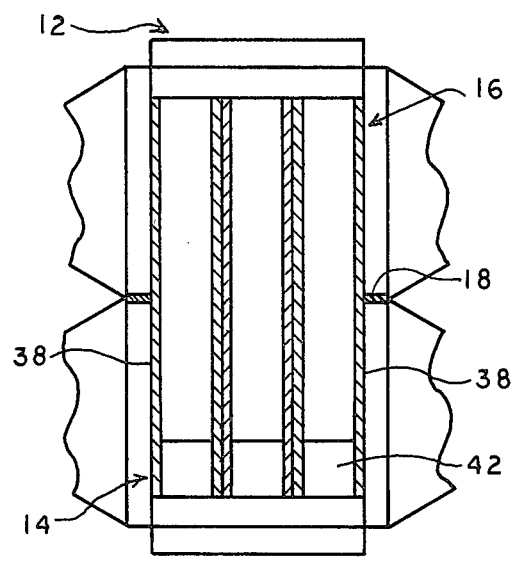
FIG. 4 is a cross-sectional view taken along line 4—4 of FIG. 3.

As best seen in FIGS. 2, 3 and 4, and in accordance with the present invention, the system 10 includes a plurality of heat pipes 38 which extend from the heat recovery chamber 14, through the partition wall 18, and into the cooling chamber 16. The heat pipes 38 are arranged in rows and are substantially rectangular in cross section providing a pair of opposed substantially planar sidewalls 38a and 38b to enable broad surface thermal contact to the thermoelectric devices 24 within the cooling chamber 16. To facilitate the collection of heat from the waste heat within the heat recovery chamber 14, the heat pipes include a plurality of integral substantially parallel, and vertically spaced heat collecting fins 40. The collecting fins 40 extend substantially perpendicularly from the planar sidewalls 38a and 38b of heat pipes 38 and lie in planes substantially parallel to the flow of the heat fluid. The heat pipes 38 and fins 40 are formed from a good thermal conductor such as for example copper, stainless steel, aluminum, or the like. The heat collected by the fins 40 is transferred by the heat pipes 38 from the heat recovery chamber 14, through the partition wall 18, and to the thermoelectric devices 24 within the cooling chamber 16. As can also be noted, the heat pipes 38 of each row are disposed side-by-side in substantially touching relationship.

The heat pipes 38 in addition to being generally rectangular, are also hollow and sealed at each end. Approximately 5–10% of the interior volume of the heat pipes 38 is occupied by a working fluid 42 such as water, for example. It has been found that this construction of heat pipe transfers heat from the heat recovery chamber 14 to the cooling chamber 16 more efficiently than solid pipes or any other known construction. In transferring heat from the heat recovery chamber 14 to the cooling chamber 16, the working fluid 42 is vaporized in that portion of the heat pipe 38 within the heat recovery chamber 14. The vaporized working fluid 42 then flows to that portion of the heat pipe 38 within the cooling chamber 16 where it gives up its heat to the thermoelectric devices 24 which are in broad surface thermal contact with the sidewalls 38a and 38b. The working fluid 42 then condenses and returns to that portion of the heat pipe 38 within the heat recovery chamber 14 to repeat the cycle of heat transfer.

The thermoelectric devices 24 cover substantially the entire surface area of the heat pipe surfaces 38a and 38b within the cooling chamber 16 and are in good thermal contact therewith. The devices 24 are touching at their edges in sealing relation. The devices are also disposed longitudinally of the heat recovery unit 12 and include outer surfaces 44 which form the cold side of the devices 24. The surfaces 44 define with each other or with the sidewalls of the unit 12 sealed passages 47 for the direction of the cooling medium through the cooling chamber to cool the cold side 44 of the thermoelectric devices 24. Because the devices 24 are sealed at their edges, they isolate the interior of the thermoelectric devices 24 from the cooling medium.

In operation of the thermoelectric system 10, hot waste exhaust gases from the operation of internal combustion engines are directed through the heat recovery chamber 14 through ducts 46 and 48 of duct means 20. Therein heat is collected by the heat collector fins 40 of the heat pipes 38. The working fluid 42 is vaporized and transfers its heat to the hot side of the thermoelectric devices 24 mounted on the planar sidewalls 38a and 38b of the heat pipes 38 within the cooling chamber 16.

The cold side of each thermoelectric device 24 is cooled by a cooling medium to establish a temperature differential across each device. In this embodiment, the cooling medium is water. The water is directed through the passages 47 of the cooling chamber 16 by ducts 50 and 52 of duct means 22. The passages 47 are exposed to the cold side of each device 24. As a result, the water contacts and cools the cold side of the devices 24.

Figure 5:
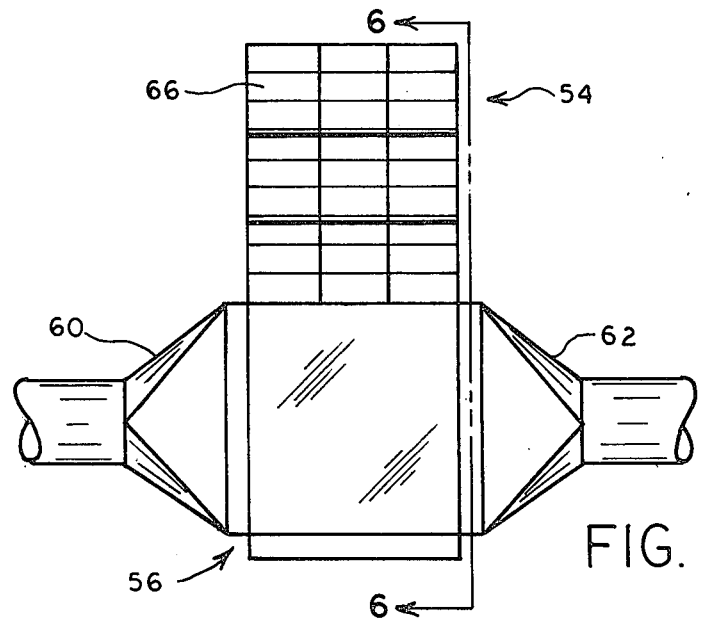
FIG. 5 is a side plan view of a thermoelectric system configured in accordance with an alternative embodiment of the present invention.
Figure 6:
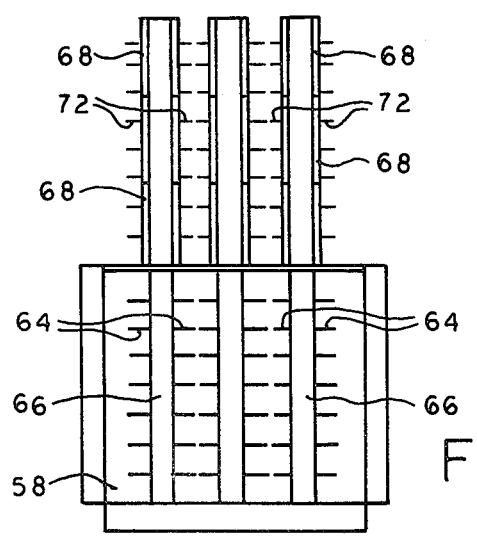
FIG. 6 is a cross-sectional view taken along line 6—6 of FIG. 5.

Turning now to FIGS. 5 and 6 there is shown a thermoelectric system 54 structured in accordance with another embodiment of the present invention. The thermoelectric system 54 includes a heat recovery unit 56 comprising a heat recovery chamber 58. Fastened to the heat recovery unit 56 are ducts 60 and 62 for directing the flow of a fluid heated by waste heat through the heat recovery chamber 58.

As in the previous embodiment, the heat recovery chamber 58 includes a plurality of heat pipes 66 having integral heat collecting fins 64 which extend perpendicularly from the heat pipes 66. The heat recovered by the fins 64 of the heat pipes 66 is transferred to an area external of the heat recovery chamber 58. Therefore, thermoelectric devices 68 are coupled to the planar sidewalls 70 of the heat pipes 66. The devices 68 are therefore heated on one side thereof by the heat conducted through the heat pipes 66.

Cooler ambient air is used to cool the other side of the thermoelectric devices 68. To aid in the utilization of ambient air to cool the thermoelectric devices, horizontally disposed and vertically spaced cooling fins 72 are attached perpendicularly to the devices 68 in good thermal contact therewith.

The operation of this embodiment parallels that of the previous embodiment except that ambient air is utilized to cool the cold side of the thermoelectric devices. The design and material considerations discussed above are the same in both embodiments except that in this alternative embodiment, a higher operating temperature is required since the cold side of the devices will be at a higher temperature.

Modifications and variations of the present invention are possible in light of the above teachings. It is therefore to be understood that within the scope of the appended claims the invention may be practiced otherwise than as specifically described.

We claim:

1. A compact thermoelectric system for generating electrical energy from a temperature difference between a flowing heated fluid and a flowing cold fluid, said system comprising:
   a thermoelectric device, said device being disposed between and in thermally transmissive contact with both a heat pipe in contact with one side thereof and said flowing cold fluid on another side thereof, whereby electrical energy is generated and current flows from the hot side to the cold side in response to the temperature difference;
   the thermally transmissive contact being provided by at least one closed heat pipe containing a working fluid therein and in thermally transmissive contact with the flowing heated fluid and the thermoelectric device
   said heat pipe being disposed within said flowing heated fluid, said heat pipe extending externally from said flowing heated fluid and having at least one integral substantially planar surface adapted to be in thermally transmissive contact with said thermoelectric device; and
   a flowing cold fluid remote from said flowing heated fluid, in thermally transmissive contact with said thermoelectric device to establish the temperature differential at said thermoelectric device, said temperature differential substantially simultaneously generating an electrical current across the thermoelectric device and condensing working fluid.

2. A system as defined in claim 1 wherein said heat pipe comprises a plurality of heat collectors integral thereto and disposed within said flowing heated fluid flow.

3. A system as defined in claim 2 wherein said heat collectors are substantially planar and lie in a plane substantially parallel to the direction of the flow of said heated fluid.

4. A system as defined in claim 2 wherein said first heat transfer means comprises a plurality of said heat pipes.

5. A system as defined in claim 4 wherein said heat collectors comprise a plurality of substantially planar fins extending from said heat pipes and being spaced apart and arranged in substantially parallel relation.

6. A system as defined in claim 1 wherein said at least one heat pipe is formed from a material having good thermal conductivity.

7. A system as defined in claim 6 wherein said heat pipe is formed from copper, stainless steel or aluminum.

8. A system as defined in claim 1 wherein said at least one heat pipe is substantially rectangular in cross section.

9. A system as defined in claim 8 wherein said heat pipe includes a working fluid therein, said fluid occupying between 5 to 10 percent of the inner volume of said heat pipe when said fluid is fully condensed.

10. A system as defined in claim 1 wherein said flowing cold fluid includes air flow cooling means for establishing at the cold side of said device a cold temperature.

11. A system as defined in claim 1 wherein said flowing cold fluid includes water flow cooling means for establishing at the cold side of said device a cold temperature.

12. A system as defined in claim 1 wherein said flowing heated fluid is isolated from said second heat transfer means.

13. A compact thermoelectric system for generating electrical energy from a temperature difference due to a flow of waste heat and a flowing cold fluid, said system comprising:

thermoelectric device means for generating said electrical energy disposed between and in thermally transmissive contact with a plurality of heat pipes in contact with one side thereof and said flowing cold fluid on another side thereof, whereby electrical energy is generated and current flows from the hot side to the cold side in response to the temperature difference;

the thermally transmissive contact being provided by a plurality of heat pipes containing working fluid therein and in thermally transmissive contact with the flowing heated fluid and the thermoelectric devices;

said plurality of heat pipes, each said heat pipe having a portion within the flow of waste heat and being of substantially rectangular cross section providing a pair of opposite substantially planar sidewalls for making broad surface thermally transmissive contact with said device means for efficiently transferring a portion of the waste heat to said thermoelectric device means; and a flowing cold fluid, being remote from said flowing heated fluid, in thermally transmissive contact with said thermoelectric device means which is lower than the temperature transferred to said thermoelectric device means by said plurality of heat pipes to thereby apply said temperature differential to said thermoelectric device means, said temperature differential substantially simultaneously generating an electrical current across the thermoelectric device and condensing working fluid.

14. A system as defined in claim 13 further comprising a first chamber for conducting said waste heat and a second chamber sealed from said first chamber for containing said flowing cold fluid and said thermoelectric device means.

15. A system as defined in claim 14 wherein said heat pipes extend from said first chamber into said second chamber.

16. A system as defined in claim 15 wherein each of said heat pipes comprises a plurality of integral heat collectors disposed within said first chamber.

17. A system as defined in claim 16 wherein said heat collectors are substantially planar and lie in a plane substantially parallel to the flow of said waste heat.

18. A system as defined in claim 13 wherein said flowing cold fluid includes air cooling means for applying said lower temperature to said device means.

19. A system as defined in claim 13 wherein said flowing cold fluid includes water cooling means for applying said lower temperature to said device means.

20. A system as defined in claim 13 wherein said heat pipes are formed from a material having good thermal conductivity.

21. A system as defined in claim 20 wherein said heat pipes are formed from copper, stainless steel or aluminum.

22. A system as defined in claim 13 wherein each said heat pipe includes a working fluid therein and wherein said working fluid occupies from 5 to 10 percent of the inner volume of said heat pipes when fully condensed.

23. A system as defined in claim 22 wherein said working fluid is water.

24. A system as defined in claim 13 further including means for isolating said waste heat from said thermoelectric device means.

25. A system as defined in claim 1 wherein each said heat pipe is substantially rectangular in cross section.

* * * * *